(12) United States Patent
Blessing

(10) Patent No.: US 7,193,727 B2
(45) Date of Patent: Mar. 20, 2007

(54) APPARATUS AND METHOD FOR MOUNTING OR WIRING SEMICONDUCTOR CHIPS

(75) Inventor: Patrick Blessing, Thalwil (CH)

(73) Assignee: Unaxis International Trading Ltd, Cham (CH)

( * ) Notice: Subject to any disclaimer, the term of this patent is extended or adjusted under 35 U.S.C. 154(b) by 259 days.

(21) Appl. No.: 10/938,430

(22) Filed: Sep. 10, 2004

(65) Prior Publication Data
US 2005/0056947 A1    Mar. 17, 2005

(30) Foreign Application Priority Data
Sep. 12, 2003 (CH) .................. 1570/03

(51) Int. Cl.
*G01B 11/24* (2006.01)
(52) U.S. Cl. .............. 356/604; 356/606; 356/630
(58) Field of Classification Search .. 356/237.1–237.5, 356/601–623, 630–632; 156/358, 352, 378
See application file for complete search history.

(56) References Cited

U.S. PATENT DOCUMENTS

| | | | | |
|---|---|---|---|---|
| 4,611,292 A | * | 9/1986 | Ninomiya et al. | 702/153 |
| 4,731,853 A | * | 3/1988 | Hata et al. | 382/153 |
| 4,802,759 A | * | 2/1989 | Matsumoto et al. | 356/603 |
| 5,076,697 A | * | 12/1991 | Takagi et al. | 356/603 |
| 5,547,537 A | | 8/1996 | Reynolds et al. | |
| 5,662,763 A | * | 9/1997 | Yamanaka | 156/358 |
| 5,745,238 A | | 4/1998 | Long et al. | |
| 6,262,803 B1 | | 7/2001 | Hallerman et al. | |
| 7,075,662 B2 | | 7/2006 | Hallerman et al. | |

FOREIGN PATENT DOCUMENTS

| | | |
|---|---|---|
| EP | 0 091 854 | 10/1983 |
| EP | 0 157 299 | 10/1985 |
| JP | 401162107 A * | 6/1989 |

OTHER PUBLICATIONS

G.S. Hopper et al., "Enhancement System Bent Chip Monitor", IBM Technical Disclosure Bulletin, vol. 25, No. 9, Feb. 1983, pp. 4821-4822.
Y.F. Wang et al., "Computation of Surface Orientation and Structure of Objects Using Grid Coding", IEEE Tranasctions on Pattern Analysis and Machine Intelligence, No. 1, Jan. 1987, pp. 129-137.
European Search Report for Application No. EP 03 10 3380, date mailed Feb. 26, 2004.

* cited by examiner

*Primary Examiner*—Hoa Q. Pham
(74) *Attorney, Agent, or Firm*—Thelen Reid Brown Raysman & Steiner LLP; David B. Ritchie

(57) ABSTRACT

An apparatus for mounting semiconductor chips onto a substrate contains a measuring station for the contactless measurement of the height of the surface of the mounted semiconductor chip facing away from the substrate at a minimum of three locations. From this, at least one parameter is calculated that characterises the adhesive layer formed between the semiconductor chip and the substrate. A difference of the measured value to a set value is used to adjust the mounting process. An apparatus for wiring semiconductor chips also contains such a measuring station in order to determine the individual height of each connection point on the semiconductor chip. This information is used in order to lower the capillary to the respective connection point on the semiconductor chip in the shortest possible time.

6 Claims, 3 Drawing Sheets

APPARATUS AND METHOD FOR MOUNTING OR WIRING SEMICONDUCTOR CHIPS

PRIORITY CLAIM

Figure 1:
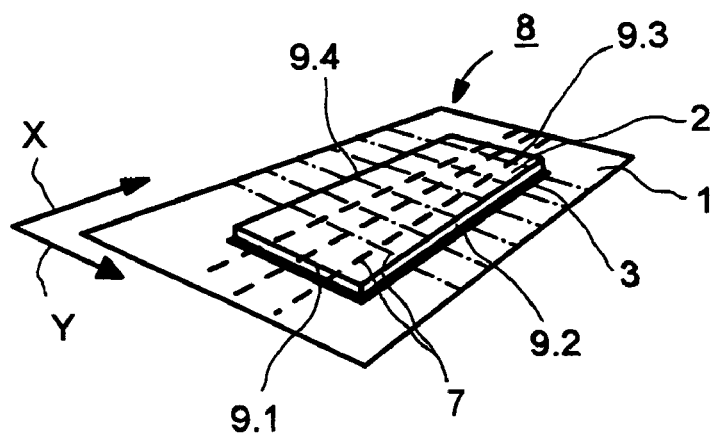

The present application claims priority under 35 U.S.C § 119 based upon Swiss Patent Application No. 1570/03 filed on Sep. 12, 2003, the disclosure of which is herein incorporated by reference.

FIELD OF THE INVENTION

The invention concerns an apparatus for mounting semiconductor chips onto a substrate, an apparatus for wiring semiconductor chips to the substrate as well as a method for operating these apparatuses. Such apparatuses are known in the trade as Die Bonder and Wire Bonder.

BACKGROUND OF THE INVENTION

With the mounting of semiconductor chips, it is important for many processes that the thickness of the adhesive layer formed between the semiconductor chip and the substrate lies within tight tolerance limits. Furthermore, it is important that the semiconductor chip mounted on the substrate demonstrates no inclination (known in technical jargon as "tilt"). To check whether the thickness of the adhesive layer and the inclination of the semiconductor chip do not exceed predefined limit values, equipped substrates have to be removed from the process as random samples and the thickness and inclination determined by means of a measuring microscope. This examination is expensive and the results are only available after a delay.

The object of the invention is to develop an apparatus for mounting semiconductor chips and a method with which the thickness of the adhesive layer between the semiconductor chip and the substrate and any inclination of the semiconductor chip can be determined in a simple way.

BRIEF DESCRIPTION OF THE INVENTION

The invention consists in that the height of the surface of the mounted semiconductor chip facing away from the substrate is measured contactlessly at a minimum of three locations and from this at least one parameter is calculated that characterises the adhesive layer formed between the semiconductor chip and the substrate. The at least one parameter is for example the thickness of the adhesive layer. However, the at least one parameter can also be the average thickness of the adhesive layer and two of the angles characterising the inclination of the semiconductor chip. With these three parameters the position of the semiconductor chip in relation to the substrate is completely determined. With the information concerning the size and thickness of the semiconductor chip, the local thickness of the adhesive layer can be calculated at any location underneath the semiconductor chip. In particular, the minimum and maximum thickness can be calculated as well as a value for the average thickness of the adhesive layer.

Determining the at least one parameter is done by means of a measuring station that comprises a light source, preferably a light source with a laser, for the production and projection of a light grid comprising at least two lines, preferably a two-dimensional network of lines, on a measuring plane formed by the two measuring axes in which the substrate with the semiconductor chip is presented, and a camera, whereby the semiconductor chip and the parts of the substrate surrounding the semiconductor chip are visible in the image delivered by the camera. The light of the light grid impinges obliquely on the measuring plane so that the lines of the light grid show an offset on the four edges of the semiconductor chip. The offset is dependent on the local height difference between the surface of the semiconductor chip and the substrate as well as on the projection angle at which the light falls on the measuring plane. The thickness of the semiconductor chip is known. When the local height difference is measured at three locations, then the inclination of the semiconductor chip and, under consideration of its thickness, the average thickness of the adhesive layer can be calculated from the corresponding offsets in the lines of the light grid at the edges of the semiconductor chip. The average thickness of the adhesive layer corresponds to the thickness underneath the geometric centre of the semiconductor chip. The light grid is preferably orientated so that its lines run almost parallel to the edges of the semiconductor chip. The image delivered by the camera defines two orthogonal measuring axes in relation to which the inclination of the semiconductor chip is determined. The semiconductor chip can be inclined in relation to both measuring axes. Therefore, the characterisation of its inclination takes place with two angles $\alpha$ and $\beta$.

When the light grid consists of a two-dimensional network, then the angles $\alpha$ and $\beta$ can be determined based on the offsets of different lines and their accuracy increased by averaging. However, it is also possible to determine the angles $\alpha$ and $\beta$ based on only two lines that can run parallel or orthogonal or in any orientation to each other.

The value derived for the average thickness of the adhesive layer is preferably compared with a set value and a possible deviation used to correct the bonding process. Here, an essential differentiation is made between two different bonding processes. With the first bonding process that is used primarily for very small semiconductor chips, the bondhead of the automatic assembly machine lowers the semiconductor chip to a predetermined height H above the substrate, whereby the height H is related to the height $H_S$ of the surface of the substrate. In doing so, the adhesive is compressed. With a deviation in the average thickness of the adhesive layer from the set value, a correction value $\Delta H$ is calculated and, on mounting subsequent semiconductor chips, the bondhead is lowered to the height $H+\Delta H$. With the second bonding process, the bondhead places the semiconductor chip onto the substrate and presses the semiconductor chip against the substrate with a predetermined force F for a predetermined time $\tau$. With a deviation in the thickness of the adhesive layer from the set value, a correction value $\Delta \tau$ and/or a correction value $\Delta F$ is calculated and, on mounting subsequent semiconductor chips, the bondhead presses the semiconductor chip against the substrate with an amended force $F+\Delta F$ and/or for an amended time $\tau+\Delta \tau$.

When one or both of the two angles $\alpha$ and $\beta$ exceeds a predetermined value, then it is advisable to readjust the orientation of the bondhead. This can be done manually or automatically.

The invention can also be applied to an apparatus for the wiring of semiconductor chips, a so-called Wire Bonder. With the wiring of semiconductor chips, a capillary guiding a wire forms wire loops between connection points on the semiconductor chip and allocated connection points on the substrate. On forming a wire loop, the capillary is first lowered at high speed above the connection point on the semiconductor chip, sharply braked shortly before impacting and then, from a so-called search height, is further lowered at a relatively low speed until the capillary touches the semiconductor chip. Because the heights of the connection points on the semiconductor chip vary from substrate to substrate, the search height is selected with a safety margin so that in no event can the capillary impact with too high a speed onto the semiconductor chip. By means of the measuring station described above, the local height difference can be determined between the surface of the semiconductor chip and the surface of the substrate. When the absolute height of the surface of the substrate and the local height difference of the surface of the semiconductor chip relative to the substrate are known at three locations, then the absolute height of each connection point on the semiconductor chip can be calculated from this. The search height can then be calculated individually for each connection point and it is no longer necessary to add a safety margin.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 2:
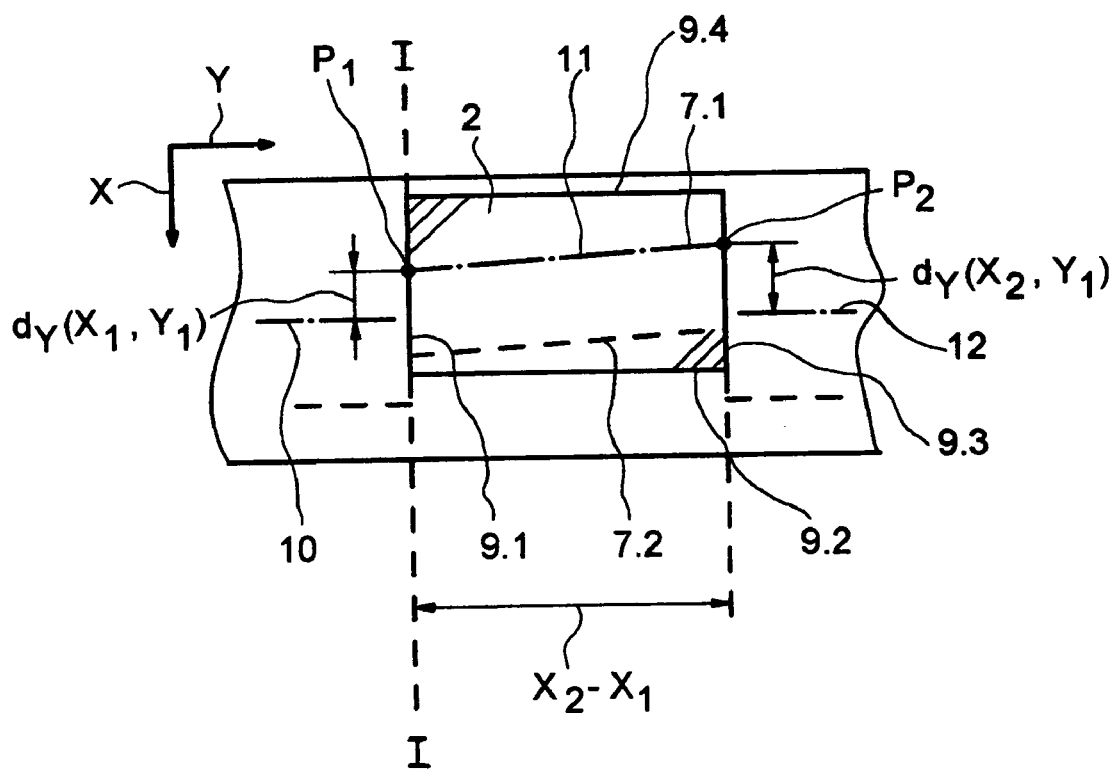
Figure 3:
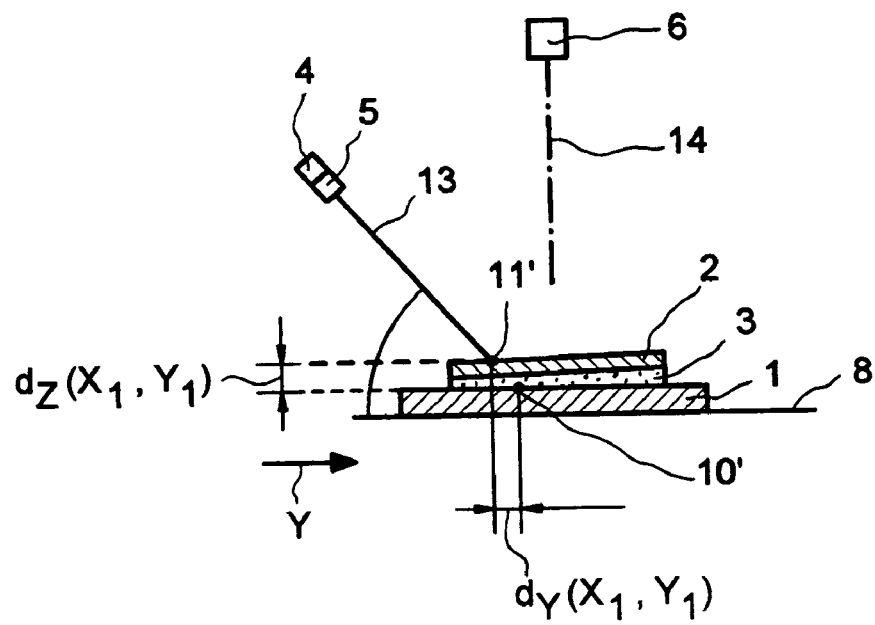
Figure 4:
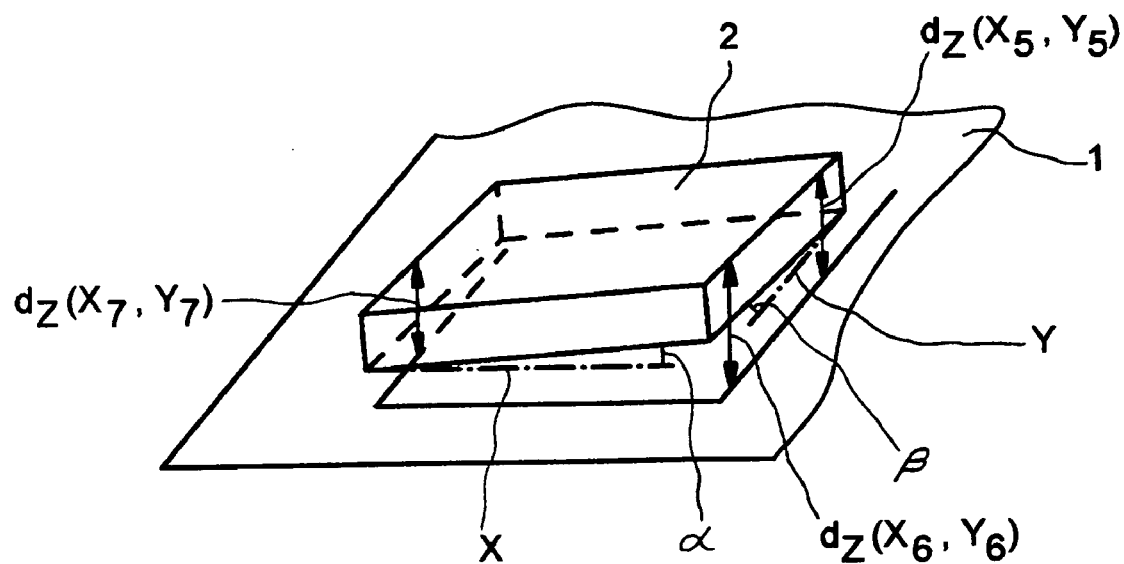
Figure 5:
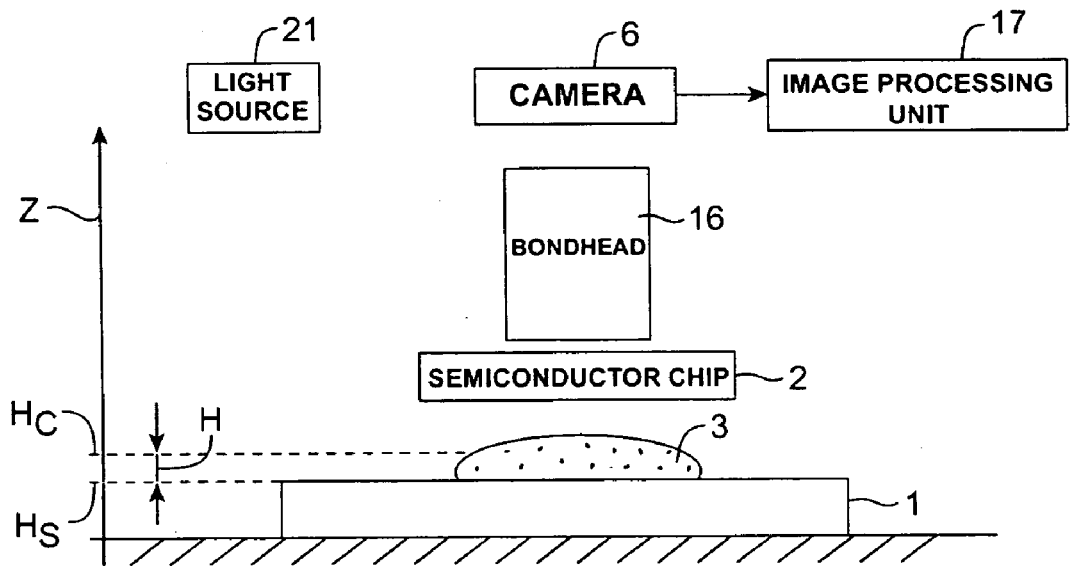
Figure 6:
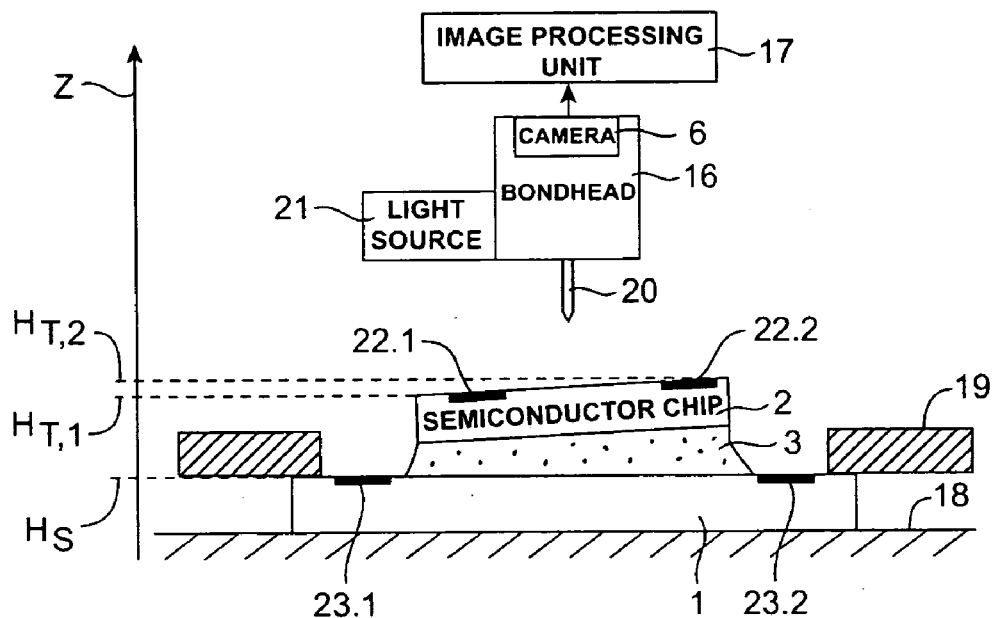

In the drawings:

FIG. 1 shows a measuring station for determining the inclination of a semiconductor chip bonded onto a substrate, FIG. 2 shows a plan view of the semiconductor chip and the substrate, FIG. 3 shows a cross-section of the semiconductor chip and the substrate along the line I—I of FIG. 2, FIG. 4 shows a perspective presentation of the semiconductor chip and the substrate, FIG. 5 shows a bondhead of an automatic assembly machine before placing the semiconductor chip onto the substrate, and FIG. 6 shows parts of a Wire Bonder before wiring a semiconductor chip.

DETAILED DESCRIPTION OF THE INVENTION

FIG. 1 shows a perspective view of a measuring station for determining the inclination of a semiconductor chip 2 bonded onto a substrate 1. The semiconductor chip 2 is secured to the substrate 1 by means of an adhesive 3. The measuring station comprises a laser 4 or other suitable light source and an optical system 5 that fans the laser beam emitted by the laser 4 (or the light source) into a light grid, as well as a camera 6 and means 15 for evaluating the image delivered by the camera 6 and determining the inclination of the semiconductor chip 2 and/or the average thickness of the adhesive layer. The light grid projected onto the semiconductor chip 2 is visible in the image delivered by the camera 6 as a two-dimensional network of individual lines 7. The laser 4 is arranged so that the light emitted from it impinges obliquely onto a measuring plane 8 in which the substrate 1 with the semiconductor chip 2 is arranged. Each single line 7 of the light grid is therefore offset on the edge of the semiconductor chip 2 the extent of which depends on the projection angle and on the local height difference between the surface of the semiconductor chip 2 and the surface of the substrate 1. This offset is determined by means of the camera 6 and from this the local height difference is calculated. In order that the sections of the individual lines 7 can be correctly allocated to each other, the distance between neighbouring lines 7 is selected greater than the maximum offset to be expected.

To characterise the inclination of the semiconductor chip 2, a cartesian system of co-ordinates is preferably used the axes of which designated x and y are defined by the image axes of the image delivered by the camera 6 and advantageously run roughly parallel to the edges 9.1 to 9.4 of the semiconductor chip 2. The x-axis and the y-axis represent two measuring axes of the measuring plane 8. The lines of the light grid are aligned so that they run roughly parallel to the edges 9.1 and 9.3 or 9.2 and 9.4 of the semiconductor chip 2 and therefore also to the two measuring axes as long as the semiconductor chip 2 demonstrates no inclination. The inclination of the semiconductor chip 2 is characterised by representation of two angles $\alpha$ and $\beta$, whereby the first angle $\alpha$ describes the inclination in relation to the x-axis and the second angle $\beta$ the inclination in relation to the y-axis. The angle $\alpha$ therefore designates the angle of inclination of the surface of the semiconductor chip 2 to the x-axis or the degree of rotation on the y-axis. Analogously, the angle $\beta$ designates the angle of inclination of the surface of the semiconductor chip 2 to the y-axis or the degree of rotation on the x-axis. With this embodiment, in order that both angles $\alpha$ and $\beta$ can be determined based on the light emitted by the single laser 4, the light has to fall obliquely on the measuring plane in relation to the x axis as well as in relation to the y axis. This is achieved when the laser is arranged not directly above the semiconductor chip 2 but, in the vertical respect, offset laterally to the semiconductor chip 2. Determining the angle $\alpha$ is now explained based on FIGS. 2 and 3.

FIG. 2 shows a plan view of the semiconductor chip 2 and the substrate 1 as well as a first line 7.1 and a second line 7.2 of the light grid as they are visible in the image delivered by the camera 6 (FIG. 1). (Other lines of the light grid have been omitted for reasons of clarity). Because the light of the light grid impinges obliquely on the semiconductor chip 2 and the substrate 1, on the edges 9.1 and 9.3 of the semiconductor chip 2 the line 7.1 has a first offset $dy(x_1, y_1)$ at location $P_1=(x_1, y_1)$ and a second offset $dy(x_2, y_1)$ at location $P_2=(x_2, y_1)$. The line 7.1 of the light grid therefore consists of three sections 10, 11 and 12. The two offsets $dy(x_1, y_1)$ and $dy(x_2, y_1)$ are the distances between the two sections 10 and 11, and 11 and 12 measured along the edge 9.1 and 9.3 of the semiconductor chip 2 in y direction. (When in the example the semiconductor chip 2 is inclined in relation to both measuring axes (x-axis and y-axis), then the section 11 does not run parallel to the edges 9.2 and 9.4 of the semiconductor chip 2.) The co-ordinates $(x_1, y_1)$ and $(x_2, y_1)$ designate the locations $P_1$ and $P_2$ where the section 11 and the edge 9.1 or the section 11 and the edge 9.3 intersect. The local height difference $dz(x_1, y_1)$ at point $P_1$ can be calculated from the offset $dy(x_1, y_1)$ between the two sections 10 and 11. The local height difference $dz(x_2, y_1)$ at point $P_2$ can be calculated from the offset $dy(x_2, y_1)$ between the two sections 11 and 12. This is explained based on FIG. 3.

FIG. 3 shows a cross-section along line I—I of the semiconductor chip 2 in FIG. 2. The thickness of the adhesive layer is uneven, ie, the semiconductor chip 2 is inclined. The line 13 shows the laser beam that produces the line 7.1 (FIG. 2). The laser beam together with the measuring plane 8 embraces the projection angle $\phi$ in relation to the y axis and therefore to the surface of the substrate 1. The sections 10 and 11 are shown in the drawing as points 10' and 11'. The height difference dz(x$_1$, y$_1$) at location P$_1$ is calculated from the first offset dy(x$_1$, y$_1$) as $$dz(x_1, y_1) = dy(x_1, y_1) * \tan \phi \qquad (1)$$

Analogously, the height difference dz(x$_2$, y$_1$) can be calculated from the second offset dy(x$_2$, y$_1$) between the two sections 11 and 12 as $$dz(x_2, y_1) = dy(x_2, y_1) * \tan \phi \qquad (2)$$

The angle α results in $$\alpha = \arctan\left(\frac{dz(x_2, y_1) - dz(x_1, y_1)}{x_2 - x_1}\right). \qquad (3)$$

The offsets dy(x$_1$, y$_1$) and dy(x$_2$, y$_1$) as well as the distance (x$_2$−x$_1$) between the two points P$_1$ and P$_2$ are determined from the image delivered by the camera 6. The equations (1) to (3) are valid in the event that the optical axis 14 of the camera 6 runs vertically to the surface of the measuring plane 8 and that the lines 7 of the light grid run parallel to the measuring axes of the camera 6, ie, here they run parallel to the x axis and the y axis. Otherwise and in particular when the optical axis of the camera 6 embraces an angle different from 90° to the measuring plane the equations (1) to (3) have to be modified.

The same considerations are valid for the line 7.2. Namely the angle α can also be determined based on the offsets of the line 7.2. In this way it is possible to use a number of n different lines of the light grid in order to achieve the angle α with greater accuracy as an average of the angles α$_1$ to α$_n$ determined from the n different lines.

Analogously, the angle β can be determined from the offsets of the lines of the light grid that run parallel to the y axis and therefore parallel to the edges 9.2 and 9.4 of the semiconductor chip 2. The equations are $$dz(x_3, y_3) = dx(x_3, y_3) * \tan \theta \qquad (4)$$

$$dz(x_3, y_4) = dx(x_3, y_4) * \tan \theta \qquad (5)$$

$$\beta = \arctan\left(\frac{dz(x_3, y_4) - dz(x_3, y_3)}{y_4 - y_3}\right) \qquad (6)$$

whereby dz(x$_3$, y$_3$) and dz(x$_3$, y$_4$) designate the local height difference at those points P$_3$=(x$_3$, y$_3$) and P$_4$=(x$_3$, y$_4$) where the edges 9.2 and 9.4 intersect with the corresponding lines of the light grid, whereby dx(x$_3$, y$_3$) and dx(x$_3$, y$_4$) designate the corresponding offsets measured in x direction, whereby y$_4$−y$_3$ designates the distance between the two edges 9.2 and 9.4 and whereby the angle θ designates the projection angle of the light grid in relation to the x axis.

Again, the measuring accuracy can be increased when the angle β is determined based on numerous lines and then an average value is calculated.

In addition to the inclination of the semiconductor chip 2 characterised by the angles α and β, the thickness of the adhesive layer can be determined as long as the thickness of the semiconductor chip 2 is known. When the thickness of the adhesive layer under the four corners of the semiconductor chip 2 is calculated based on the height difference at point P$_1$, the thickness of the semiconductor chip 2, the distance of the four corners from point P$_1$ and the determined angles α and β, then the minimum thickness and the maximum thickness of the adhesive layer as well as an average thickness of the adhesive layer can be calculated from this.

FIG. 4 shows a perspective presentation of the semiconductor chip 2 mounted on the substrate 1. The semiconductor chip 2 has an inclination that is characterised by the two angles α and β. In FIG. 4, three height differences dz(x$_5$, y$_5$), dz(x$_6$, y$_6$) and dz(x$_7$, y$_7$) are drawn. These height differences were determined for example by means of the method on the basis of the offsets in the lines 7.1 and 7.2 on the edges 9.1 and 9.3 of the semiconductor chip 2 as described based on FIGS. 2 and 3. As each specialist knows, the angles α and β can be calculated from the height differences dz(x$_5$, y$_5$), dz(x$_6$, y$_6$) and dz(x$_7$, y$_7$) by means of conventional geometry. When y$_7$=y$_6$, then the following is valid:

$$\alpha = \arctan\left(\frac{dz(x_6, y_6) - dz(x_7, y_7)}{x_6 - x_7}\right) \qquad (7)$$

$$\beta = \arctan\left(\frac{dz(x_6, y_6) - dz(x_5, y_5)}{y_6 - y_5}\right) \qquad (8)$$

As this embodiment shows, a minimum of only two lines of the light grid are necessary to determine the angles α and β whereby the two lines can have any orientation to one another. This means, the two lines can run parallel to one another or they can run orthogonally to one another or they can run obliquely to one another at any angle. Preferably, the lines run parallel to the edges of the semiconductor chip because then the necessary calculations are easiest. When the two lines run parallel to each other, then it suffices when the light only impinges on the substrate 1 obliquely in relation to the x-axis or the y-axis. This means, the light source is to be arranged above the semiconductor chip 2 offset laterally in relation to only the x-axis or the y-axis.

The height differences at the four corners of the semiconductor chip 2 can be calculated from any of the three height differences dz(x$_5$, y$_5$), dz(x$_6$, y$_6$) or dz(x$_7$, y$_7$) and the angles α and β and therefore, when the thickness of the semiconductor chip is known, a parameter characterising the thickness of the adhesive layer can be calculated such as for example the minimum, maximum and/or average thickness of the adhesive layer.

The measuring station is particularly suitable for use on an automatic assembly machine for the mounting of semiconductor chips onto a substrate, a so-called Die Bonder, in order to determine the average thickness of the adhesive layer and to detect any inclination of the bonded semiconductor chip in relation to two measuring axes. The measured value for the average thickness of the adhesive layer is advantageously used in order to automatically adapt the parameters of the bonding process. If the extent of the inclination exceeds a predetermined value, an alarm is initiated and/or the Die Bonder is stopped so that the inclination of the bondhead can be readjusted by an operator. In the trade, Die Bonders are well-known automatic machines. One Die Bonder from the Assignee is known for example from the U.S. Pat. No. 6,185,815.

As already mentioned in the introduction, in a first category of bonding processes, the semiconductor chip 2 is lowered by the bondhead 16 of the automatic assembly machine to a predetermined height H above the substrate 1 whereby the height H is related to the surface of the substrate 1. FIG. 5 illustrates this. The height H$_S$ of the surface of the substrate 1 is measured by a device not described here. A suitable device is described for example in the European patent application No. 04103089.1. The surface of the substrate 1 forms the measuring plane formed by the two measuring axes. The lines of the light grid radiated from the light source 21 impinge obliquely on the substrate 1 at a predetermined projection angle so that each of the lines of the light grid impinging on the semiconductor chip 2 is offset on at least two edges of the semiconductor chip 2. The evaluation of the image delivered by the camera 6 and the calculation of the inclination take place in an image processing unit 17 whereby the image processing unit 17 is a separate module or is part of the computer of the automatic assembly machine.

The bondhead is lowered to the height $H_C$ that is given by $$H_C = H_S + H + \Delta H,$$

whereby $\Delta H$ is a correction value that is set equal to zero at the start of production.

As soon as the bonding process is completed and the bondhead 16 is moved away, the average thickness D of the adhesive layer is determined as was explained based on FIGS. 1 to 4. From the difference $D-D_S$ between the average thickness D and a set value $D_S$ for the average thickness, a correction value $\Delta H_1$ is calculated as $\Delta H_1 = -(D-D_S)$. The value $\Delta H$ to be used for the effective correction of the bonding process is calculated by means of known statistical methods from the values $\Delta H_1$ continuously determined during the bonding of consecutive semiconductor chips. The value $\Delta H$ is therefore an averaged value so that a single measurement only has a limited influence.

With a second category of bonding processes, mounting of the semiconductor chips takes place in that the semiconductor chip is pressed against the substrate with a predetermined bond force F for a predetermined bond time $\tau$. In doing so, the adhesive present between the semiconductor chip and the substrate is compressed and deformed whereby a uniform adhesive layer is formed free of air bubbles. As soon as the bonding process is completed and the bondhead is moved away, the average thickness D of the adhesive layer is determined. From the difference $D-D_S$ between the average thickness D and a set value $D_S$ for the average thickness either a correction value $\Delta \tau_1$ is calculated and/or a correction value $\Delta F_1$. From individual values $\Delta \tau_1$ and $\Delta F_1$ determined for several consecutively mounted semiconductor chips, averaged correction values $\Delta \tau$ and $\Delta F$ are determined by means of statistical methods as with the previous example. The averaged correction values $\Delta \tau$ and $\Delta F$ are used in order to modify either the bond force F or the bond time $\tau$ or the bond force F and the bond time $\tau$.

The measuring station is however also suitable for use on a automatic assembly machine for the wiring of semiconductor chips, a so-called Wire Bonder, in order to detect any inclination of the bonded semiconductor chips in relation to two orthogonal measuring axes and to calculate from the measured values the height above the substrate, designated as the z height, of each connection point (pad) onto which a wire is to be bonded. The exact knowledge of the z height of the individual connection points enables the capillary to be lowered to each individual connection point with the highest possible speed and therefore to reduce the time for a bond cycle. In the trade, Wire Bonders are well-known automatic machines. A Wire Bonder from the applicant is known for example from the U.S. Pat. No. 6,460,751. FIG. 6 shows a schematic cross-section of the parts of a Wire Bonder necessary for the understanding of the invention. For reasons of illustrative clarity, the bondhead 16 is drawn much too small in comparison with the substrate 1 and the semiconductor chip 2. For the illustration, the semiconductor chip 2 mounted on the substrate 1 is presented with an inclination far exceeding the permitted limit value. The Wire Bonder comprises a heatable support 18 for the substrate 1, a downholder arrangement 19 for holding down the fingers of the substrate 1 against the support 18 and a bondhead 16 that moves the capillary 20 guiding the wire in space, as well as a camera 6 for measuring the position of the connection points on the substrate 1 and the semiconductor chip 2. As a rule, the camera 6 is secured to the bondhead 16. In addition, a light source 21 is secured to the bondhead 16 that produces the light grid necessary for measurement. With this example, only two connection points 22.1, 22.2 are present on the semiconductor chip 2 and two connection points 23.1, 23.2 on the substrate 1. The height of the connection points is designated as the z height. Wiring of the semiconductor chip 2 to the substrate 1 takes place in accordance with the following steps:

Holding down the substrate 1, switching on the light source 21, in order to project a light grid consisting of at least two lines onto the substrate 1. The surface of the substrate 1 forms the measuring plane formed by the two measuring axes. The lines of the light grid emitted by the light source 21 impinge obliquely on the substrate 1 at a predetermined projection angle so that each of the lines of the light grid impinging on the semiconductor chip 2 is offset on at least two edges of the semiconductor chip 2, recording an image of the semiconductor chip 2 and the parts of the substrate 1 surrounding the semiconductor chip 2, calculating the z heights $H_{T,1}$ and $H_{T,2}$ of the connection points 22.1, 22.2 on the semiconductor chip 2 relative to the surface of the substrate 1 based on at least three offsets in the lines of the light grid on the at least two edges of the semiconductor chip 2, preferably and so long as not yet known: Determining the z height $H_S$ of the substrate 1, and calculating an individual search height $H_{R,1}$ and $H_{R,2}$ for each of the connection points 22.1, 22.2 on the semiconductor chip 2, and wiring the first connection points 22.1, 22.2 on the semiconductor chip 2 to the second connection points 23.1, 23.2 on the substrate 1 under consideration of the individual search heights $H_{R,1}$ and $H_{R,2}$ of each connection point 22.1, 22.2 on the semiconductor chip 2.

The individual search height results from the z height by the addition of a predetermined constant value h: $H_{R,1} = H_{T,1} + h$ and $H_{R,2} = H_{T,2} + h$.

The invention enables the capillary 20 to be lowered at maximum speed to the individual search height $H_T$ of the respective connection point 22.1 and 22.2 on the semiconductor chip 2. The distance from the individual search height $H_R$ up to the connection point is therefore always the same size independent of the inclination of the semiconductor chip 2. The predetermined constant h is selected as small as possible adapted to the dynamic characteristics of the Wire Bonder. A resulting advantage is a shorter cycle time and therefore a greater throughput on the Wire Bonder.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting semiconductor chips onto a substrate, whereby an adhesive layer is formed between the substrate and the semiconductor chip, comprising
   a camera, in an image of which the semiconductor chip and parts of the substrate surrounding the semiconductor chip are visible,
   a light source for producing and projecting a light grid consisting of at least two lines onto the substrate, whereby the lines of the light grid impinge obliquely on the substrate at a predetermined projection angle so that each of the lines of the light grid impinging on the semiconductor chip is offset on at least two edges of the semiconductor chip, and
   an image processing unit for calculating at least one parameter characterising the adhesive layer from the image delivered by the camera based on at least three offsets.

2. The apparatus according to claim 1, wherein the at least one parameter characterising the adhesive layer is an average thickness of the adhesive layer.

3. A method for mounting semiconductor chips onto a substrate, the method comprising the steps:
   lowering a bondhead carrying a semiconductor chip to a height H above a substrate for mounting the semiconductor chip onto the substrate,
   determining at least one parameter characterizing an adhesive layer that is formed between the substrate and the semiconductor chip,
   from a possible deviation of the at least one parameter from a set value calculating a correction value $\Delta H$, and
   lowering the bondhead to a height $H+\Delta H$ for mounting a subsequent semiconductor chip, wherein the determination of the at least one parameter comprises the following steps:
   projecting a light grid comprising at least two lines onto the substrate with the semiconductor chip, whereby the lines of the light grid impinge obliquely on the substrate so that each of the lines of the light grid impinging on the semiconductor chip is offset on at least two edges of the semiconductor chip,
   recording an image of the semiconductor chip and parts of the substrate surrounding the semiconductor chip, and
   calculating the at least one parameter based on at least three offsets of the lines of the light grid on the at least two edges of the semiconductor chip.

4. The apparatus according to claim 3, wherein the at least one parameter characterising the adhesive layer is an average thickness of the adhesive layer.

5. A method for mounting semiconductor chips onto a substrate, the method comprising the following steps:
   placing a semiconductor chip on a substrate and pressing the semiconductor chip against the substrate for a time $\tau$ and with a force F,
   determining at least one parameter characterizing an adhesive layer that is formed between the substrate and the semiconductor chip,
   from a possible deviation of the at least one parameter from a set value calculating a correction value $\Delta \tau$ and/or a correction value $\Delta F$,
   and placing a subsequent semiconductor chip on the substrate and pressing the subsequent semiconductor chip against the substrate for a modified time $\tau+\Delta\tau$ and/or with a modified force $F+\Delta F$,
   wherein the determination of the at least one parameter comprises the following steps:
   projecting a light grid comprising at least two lines onto the substrate with the semiconductor chip, whereby the lines of the light grid impinge obliquely on the substrate so that each of the lines of the light grid impinging on the semiconductor chip is offset on at least two edges of the semiconductor chip,
   recording an image of the semiconductor chip and parts of the substrate surrounding the semiconductor chip, and
   calculating the at least one parameter based on at least three offsets of the lines of the light grid on the at least two edges of the semiconductor chip.

6. The method according to claim 5, wherein the at least one parameter characterising the adhesive layer is an average thickness of the adhesive layer.

* * * * *